United States Patent
Vega et al.

(10) Patent No.: US 12,463,130 B2
(45) Date of Patent: Nov. 4, 2025

(54) WRAP AROUND METAL VIA STRUCTURE

(71) Applicant: International Business Machines Corporation, Armonk, NY (US)

(72) Inventors: Reinaldo Vega, Mahopac, NY (US); Nicholas Anthony Lanzillo, Wynantskill, NY (US); Albert M. Chu, Nashua, NH (US); Lawrence A. Clevenger, Saratoga Springs, NY (US); Ruilong Xie, Niskayuna, NY (US); Brent A Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 445 days.

(21) Appl. No.: 17/989,932

(22) Filed: Nov. 18, 2022

(65) Prior Publication Data

US 2024/0170392 A1  May 23, 2024

(51) Int. Cl.
*H01L 23/522* (2006.01)
*H01L 23/528* (2006.01)
*H01L 23/532* (2006.01)

(52) U.S. Cl.
CPC ........ *H01L 23/5226* (2013.01); *H01L 23/528* (2013.01); *H01L 23/53209* (2013.01)

(58) Field of Classification Search
CPC .............. H01L 23/5226; H01L 23/528; H01L 23/53209

USPC ......................................................... 257/734
See application file for complete search history.

(56) References Cited

U.S. PATENT DOCUMENTS

| | | | |
|---|---|---|---|
| 623,901 | A | 4/1899 | Hadfield |
| 6,239,016 | B1 | 5/2001 | Ishikawa |
| 6,350,672 | B1 | 2/2002 | Sun |
| 6,475,858 | B2 | 11/2002 | Sugiyama et al. |
| 6,746,945 | B2 | 6/2004 | Orita |
| 7,772,706 | B2 | 8/2010 | Balakrishnan et al. |
| 8,987,917 | B2 | 3/2015 | Maki |
| 10,312,139 | B2 | 6/2019 | Tsai et al. |
| 10,879,112 | B2 | 12/2020 | Anderson et al. |
| 2003/0109123 | A1* | 6/2003 | Orita ............. H01L 21/31116 257/E21.252 |
| 2015/0348903 | A1* | 12/2015 | Melzner ............. H01L 23/5226 257/774 |
| 2018/0315700 | A1 | 11/2018 | Boyanov |
| 2019/0287879 | A1* | 9/2019 | Sauter ............. H01L 23/488 |

FOREIGN PATENT DOCUMENTS

JP          2012134422 A      7/2012

* cited by examiner

*Primary Examiner* — Tu-Tu V Ho
(74) *Attorney, Agent, or Firm* — Scully, Scott, Murphy & Presser, P.C.; Kimberly Zillig

(57) ABSTRACT

A structure is provided that includes a first metal level including a first metal line, a second metal level spaced apart from the first metal level and including a second metal line, and a first metal via structure connecting the first metal line to the second metal line. The first metal via structure directly contacts a sidewall surface and a horizontal surface of the first metal line.

20 Claims, 4 Drawing Sheets

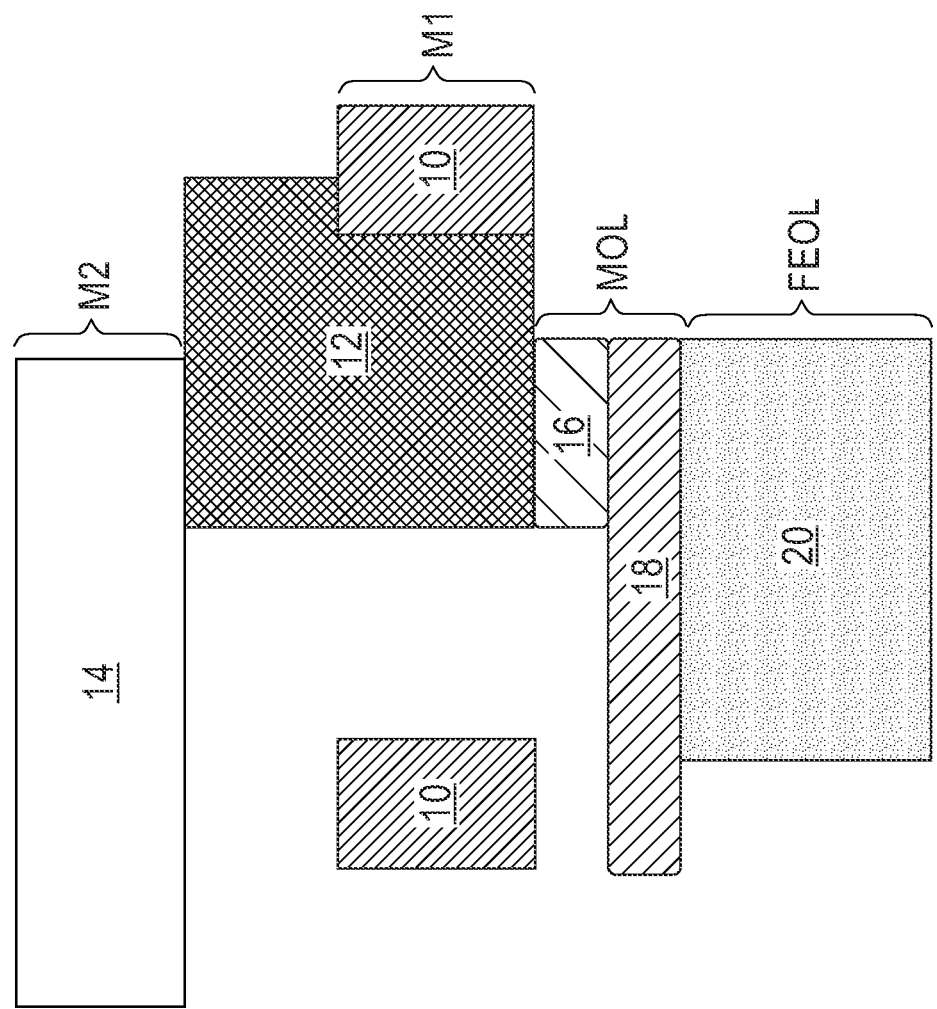
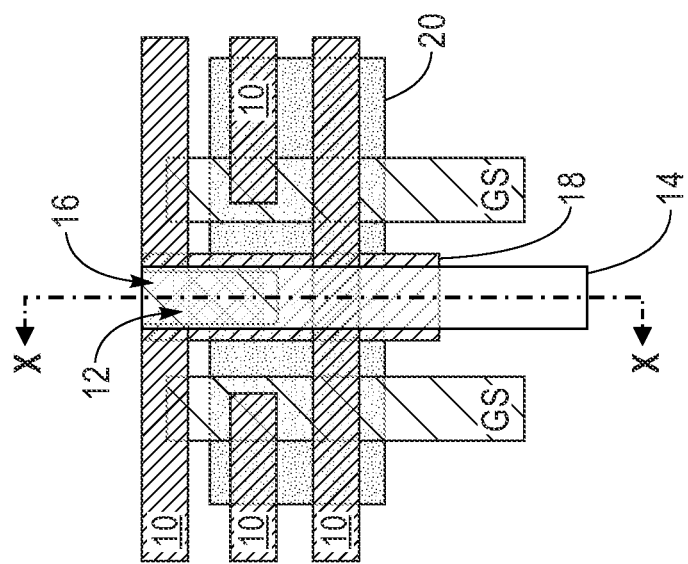
FIG. 4A
FIG. 4B

WRAP AROUND METAL VIA STRUCTURE

BACKGROUND

The present application relates to semiconductor technology, and more particularly to a structure including a metal via structure for connecting a first metal line present in a first metal level to a second metal line that is present in a second metal level.

In integrated circuits (ICs), interconnects are structures that connect two or more circuit elements (such as transistors) together electrically. The design and layout of interconnects on an IC is vital to its proper function, performance, power efficiency, reliability, and fabrication yield. In fabrication, interconnects are typically formed during the back-end-of-the-line after the fabrication of the transistors on the substrate. In some cases, interconnects can include a metal via structure that can electrically connect a first metal line that is present in a first, metal level to a second metal line that is present in a second metal level that is located above the first metal level. In such interconnects, the metal via structure contacts a topmost surface of first metal line and a bottommost surface of the second metal line.

SUMMARY

A metal via structure for connecting a first metal line present in a first metal level to a second metal line that is present in a second metal level is provided. The metal via structure directly contacts a horizontal surface and a sidewall surface of the first metal line as well as a horizontal surface of the second metal line. The metal via structure can enable a low resistance connection to the first metal line and can provide connection to an outermost track without interfering with an adjacent cell on a next circuit row. The metal via structure can also enable a wide (e.g., 2×1) via with a unidirectional first metal level.

In one aspect of the present application, a structure is provided. In one embodiment, the structure of the present application includes a first metal level including a first metal line, a second metal level spaced apart from the first metal level and including a second metal line, and a first metal via structure connecting the first metal line to the second metal line. In accordance with the present application, the first metal via structure directly contacts a sidewall surface and a horizontal surface of the first metal line. This first metal via structure can be referred to as a wrap around metal via since it contacts both a horizontal surface and a sidewall surface of the first metal line.

BRIEF DESCRIPTION OF THE DRAWINGS

FIG. 4A is a top down view of an exemplary structure in accordance with a further embodiment of the present application.

FIG. 4B is a cross sectional view of the exemplary structure shown in FIG. 4A; the cross section is through X-X shown in FIG. 4A.

DETAILED DESCRIPTION

Figure 1B:
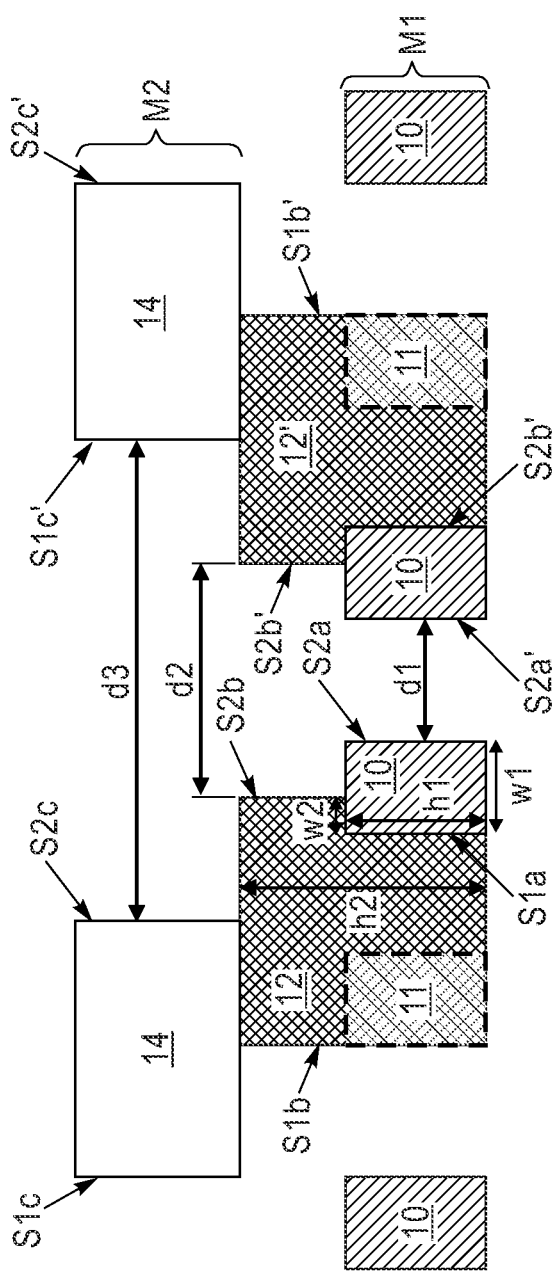
FIG. 1B is a cross sectional view of the exemplary structure shown in FIG. 1A.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In the present application, chemical elements can be referred to using their chemical symbol from the Periodic Table of Elements. For example, aluminum can be referred to as "Al", tungsten can be referred to as "W", copper can be referred to as "Cu", etc.

Figure 1A:
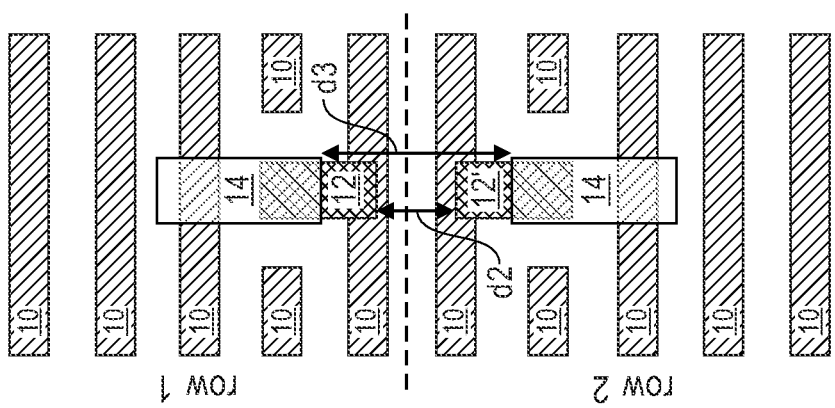
FIG. 1A is a top down view of an exemplary structure in accordance with an embodiment of the present application.

Reference is first made to FIGS. 1A-1B, which illustrate an exemplary structure in accordance with an embodiment of the present application. Notably, the exemplary structure shown in FIGS. 1A-1B includes a first metal level, M1, including a first metal line 10, and a second metal level, M2, spaced apart from the first metal level, M1 and including a second metal line 14. The exemplary structure shown in FIGS. 1A-1B also includes a first metal via structure 12 connecting the first metal line 10 to the second metal line 14. In accordance with the present application, the first metal via structure 12 directly contacts a sidewall surface and a horizontal surface of the first metal line 10. The first metal level, M1, can also include additional first metal lines 10 and the second metal level, M2, can include additional second metal lines 14. Also, and as is illustrated, other metal via structures can be present arranged in the same manner as this first metal via structure 12. In FIG. 1B, the doted region 11 denotes a cut region in which one of the first metal lines is cut into two segments to make room for the first metal via structure 12. These two cut first metal line segments would run into and out of the plane of the drawing sheet that contains FIG. 1B.

In the illustrated embodiment, the first metal via structure 12 directly contacts a horizontal surface of the second metal line 14. This horizontal surface of the second metal line 14 can be a bottommost surface, as is illustrated, for embodiments in which the first and second metal levels, M1 and M2, are located on a frontside of a semiconductor wafer. In other embodiments, not shown, this horizontal surface of the second metal line 14 can be a topmost surface, for embodiments in which the first and second metal levels, M1 and M2, are located on a backside of a semiconductor wafer.

In the present application, the term "frontside" denotes a side of a semiconductor wafer which includes at least one semiconductor device (i.e., transistor), while the term "backside" denotes a side of the semiconductor wafer that is opposite the side of the semiconductor wafer including the at least one semiconductor device.

In the present application, the first metal level, M1, (whether present on the frontside or the backside of the semiconductor wafer) is closest to the semiconductor wafer containing the one or more semiconductor devices than the second metal level, M2.

In the present application, the first metal level, M1, and the second metal level, M2, and the first metal via structure 12 collectively provide an interconnect structure that can be present on the frontside and/or the backside of a semiconductor wafer.

In the present application, each first metal line 10 that is present in the first metal level, M1, is embedded in a first interlayer dielectric material layer (not shown), each second metal line 14 that is present in the second metal level, M2, is embedded in a third interlayer dielectric material layer (not shown), and the metal via structure 12 includes a first portion that is embedded in a second interlayer dielectric material layer (not shown) that is located between the first and second interlayer dielectric material layers, and a second portion that is embedded in the first interlayer dielectric material layer. The first, second and third interlayer dielectric material layers can include a dielectric material such as, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" denotes a dielectric material that has a dielectric constant of less than 4.0. All dielectric constants mentioned herein are measured in a vacuum unless otherwise indicated. The dielectric material that provides the first interlayer dielectric material layer can be compositionally the same as, or compositionally different from, the dielectric material that provides the second interlayer dielectric material layer, and/or the dielectric material that provides the third interlayer dielectric material layer. The dielectric material that provides the second interlayer dielectric material layer can be compositionally the same as, or compositionally different from, the dielectric material that provides the third interlayer dielectric material layer In embodiments (not shown), a dielectric capping layer can be present between the various interlayer dielectric material layers. When present the dielectric capping layer is composed of a dielectric capping material that is typically compositionally different from the dielectric material that provides the various interlayer dielectric material layers. Illustrative examples of dielectric capping materials that can be employed in the present application include, but are not limited to, silicon carbide, silicon nitride, silicon oxide, a carbon doped oxide, a nitrogen and hydrogen doped silicon carbide (SiC(N,H)) or a multilayered stack of at least one of the aforementioned dielectric capping materials.

In the present application, the first metal lines 10, the second metal lines 14 and the metal via structures (including the first metal via structure 12 and the second metal via structure 12' to be mentioned below) are each composed of an electrically conductive metal or an electrically conductive metal alloy. Illustrative examples of electrically conductive metals that can be used in providing the metal lines and the metal via structures of the present application include, but are not limited to, Cu, Al, W, Ru or Co. Illustrative examples of electrically conductive metal alloys that can be used in the present application to provide the metal lines and metal via structures include, but are not limited to, a Cu—Al alloy, a Cu—W alloy, or Ru—Co alloy. In the present application, the first metal lines 10 can be composed of a compositionally same, or compositionally different, electrically conductive material than the second metal lines 14 and/or the first metal via structure 12. In some embodiments, the first metal lines 10, the second metal lines 14 and the metal via structures are each composed of Cu.

Although not shown in the present application, the metal lines, i.e., first metal lines 10 and second metal lines 14, as well as the metal via structures can have a diffusion barrier liner present on a sidewall and bottom wall thereof. The diffusion barrier liner that can optionally be employed in the present application is composed of a diffusion barrier material that prevents another material from diffusing therethrough. Illustrative examples of diffusion barrier materials that can be used as the diffusion barrier liner include, but are not limited to, Ta, TaN, Ti, TiN, W or WN. In some embodiments, the diffusion barrier liner can include a material stack of two or more diffusion barrier materials. In one example, the diffusion barrier liner can be composed of a stack of Ta/TaN or Ti/TiN. The diffusion barrier liner can have a thickness from 2 nm to 50 nm; although other thicknesses for the diffusion barrier liner are contemplated and can be employed in the present application.

In the present application, and as is illustrated in FIGS. 1A-1B, each second metal line 14 is orthogonally, i.e., perpendicularly, orientated to the first metal lines 10. That is, each first metal line 10 runs in a first direction and each second metal line 14 runs in a second direction which is at a right angle to the first direction. In the present application, each of the first metal lines 10 can be arranged in rows, while each of the second metal lines 14 can be arranged in columns. In the present application, the first metal lines 10 are laterally separated from each other and are orientated parallel to each other, and the second metal lines 14 are vertically spaced apart from the first metal lines 10, and each of the second metal lines 14 are laterally separated from each other and are orientated parallel to each other.

In embodiments of the present application, the first metal via structure 12 has a first outermost sidewall, S1$b$, and a second outermost sidewall, S2$b$, wherein the first outermost sidewall, S1$b$, of the first metal via structure 12 is located between a first outermost sidewall, S1$c$ of the second metal line 14 and a second outermost sidewall, S2$c$, of the second metal line 14, and the second outermost sidewall, S2$b$, of the first metal via structure 12 is located between a first outermost sidewall, S1$a$, of the first metal line 10 and a second outermost sidewall, S2$a$, of the first metal line 10. This results in the d2 spacing from FIG. 1B being greater than, or equal to, the d1 spacing from FIG. 1B. Conventionally, when a via is patterned over a metal line, the via must have an enclosure margin to the underlying metal line in order to assure full via contact in the event of a patterning alignment offset. This means that, in the nominal case, d2<d1. For tight metal pitches, this can result in adjacent vias shorting together or otherwise being separate but with small enough spacing to pose a reliability risk (e.g., TDDB—time-dependent dielectric breakdown). By setting d2>=d1, this problem is avoided, but then one must wrap the via around the other side of the metal line in order to achieve low contact resistance. Another reason this is important is because the M2 tip-to-tip spacing may also be a limiting factor in achieving a zero-track-skip. Even if the vias can be patterned with enclosures such that d2<d1, there are other patterning limits regarding M2 which may restrict how close two M2 line ends can be to each other This means the minimum M2 tip spacing could end up being greater than the minimum spacing between the underlying vias. In such a case, M2 tips need to be pulled back and so what is needed is a wide via structure to enable a connection between two separate, but adjacent M2 segments and two correspondingly separate, but adjacent M1 tracks.

In the present application, the first metal line 10 has a first width, w1, and the first metal via structure 12 overlaps the horizontal surface of the first metal line 10 by a second width, w2, wherein the second width, w2, is less than the first width, w1. The second width, w2, can be referred to as an overlap width. This satisfies d2>=d1 mentioned above.

In embodiments of the present application, the first metal line 10 has a first height, h1, and the first metal via structure 12 has a second height, h2, wherein the second height, h2, is greater than the first height, h1. In one example, the second height, h2, is from 1.5 to 2.0 times, greater than the first height, h1.

In embodiments of the present application, the first metal via structure 12 has a horizontal surface that is coplanar with a horizontal surface of the first metal line 10. In the illustrated embodiment of FIG. 1B (which is for a frontside embodiment), the first metal via structure 12 has a bottommost surface that is coplanar with a bottommost surface of the first metal line 10. In a backside embodiment (not shown), the first metal via structure 12 would have a topmost surface that is coplanar with a topmost surface of the first metal line 10.

In some embodiments of the present application, the first metal via structure 12 contacts a horizontal surface and a sidewall surface of another first metal line present in the first metal level, M1. In the present application, this other first metal line that the first metal via structure 12 can contact is typically removed by lithography and etching to provide sufficient space between adjacent first metal lines 12 for accommodating the first via metal structure 12.

In embodiments of the present application, the first metal level, M1, includes at least one other first metal line 10, and the second metal level, M2, includes at least one other second metal line 14, and a second metal via structure 12' connects the least one other first metal line 10 to the at least one other second metal line 14, wherein the second metal via structure 12' directly contacts a sidewall surface and a horizontal surface of the at least one other first metal line 10. Note that the second metal via structure 12' has the same properties as the first metal via structure 12 mentioned above. In such embodiments, the second metal via structure 12' directly contacts a horizontal (topmost or bottommost) surface of the other second metal line 14 depending whether the interconnect structure is present on the frontside or backside of the semiconductor wafer. To make room for the second metal via structure 12', another of the first metal lines is cut into two segments providing a second cut region 11 shown in FIG. 1B. Although not specifically labeled in FIG. 1B, the second metal via structure 12' overlaps the horizontal surface of the other first metal line 10 by a second width, w2, wherein the second width, w2, is less than the first width, w1 of the other first metal line 10.

In some embodiments, the first metal line 10 and the other first metal line 10 are separated by a first distance, d1, the first metal via structure 12 and the second metal via structure 12' are separated by a second distance, d2, and the second metal line 14 and the other second metal line 14 are separated by a third distance, d3, wherein d1 is less than d2, and d2 is less than d3. Stated in other terms, d1<d2<d3. In one example, d1 is from 6 nm to 14 nm, d2 is from 14 nm to 28 nm, and d3 is from 18 nm to 30 nm.

In embodiments of the present application, the second metal via structure 12' has a first outermost sidewall, S1b', and a second outermost sidewall, S2b', wherein the first outermost sidewall, S1b', of the second metal via structure 12' is located between a first outermost sidewall, S1c', of the other second metal line 14 and a second outermost sidewall, S2c', of the other second metal line 14, and the second outermost sidewall, S2b', of the second metal via structure 12' is located between a first outermost sidewall, S1a', of the other first metal line 10 and a second outermost sidewall, S2b', of the other first metal line 10.

In embodiments of the present application, the first metal line 10 and the another first metal line 10 have a first height, h1, and the first metal via structure 12 and the second metal via structure 12' have a second height, h2, wherein the second height, h2 is greater than the first height, h1.

In embodiments of the present application, the first metal via structure 12 has a horizontal surface (topmost or bottommost) that is coplanar with a horizontal surface (topmost or bottommost) of the first metal line 10, and the second metal via structure 12' has a horizontal surface (topmost or bottommost) that is coplanar with a horizontal surface (topmost or bottommost) of the other first metal line 10 and the horizontal surface of both the first metal via structure 12 and the second metal via structure 12' are coplanar with each other, as is shown in FIG. 1B.

Figure 2B:
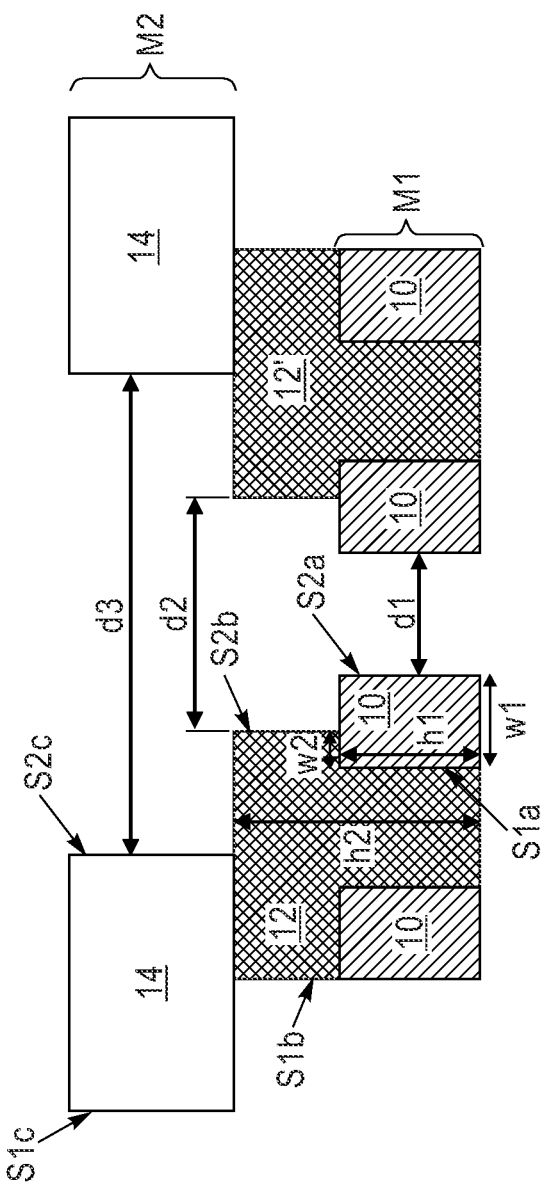
FIG. 2B is a cross sectional view of the exemplary structure shown in FIG. 2A.
Figure 2A:
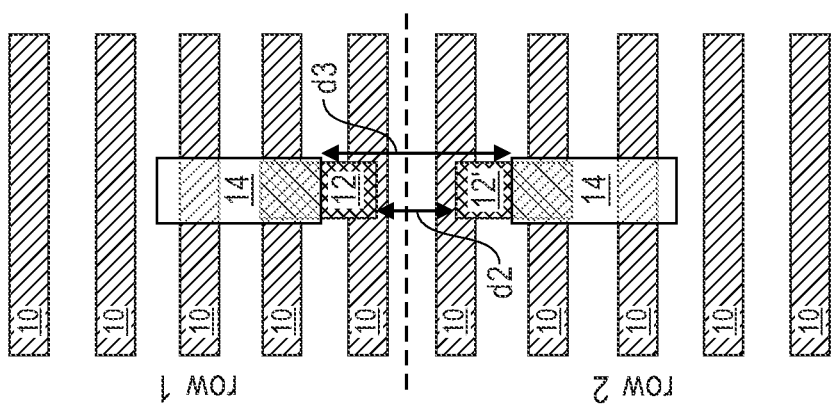
FIG. 2A is a top down view of an exemplary structure in accordance with another embodiment of the present application.

Reference now to FIG. 2A-2B, which illustrate another exemplary structure in accordance with the present application. The exemplary structure illustrated in FIGS. 2A-2B is similar to the one depicted in FIGS. 1A-1B except that each metal via structure (e.g., the first metal via structure 12 and the second metal via structure 12') contacts a horizontal surface and a sidewall surface of two adjacent first metal lines 10. Notably, each metal via structure merges two parallel first metal lines. This configuration reduces signal path resistance for tight metal pitches. This exemplary structure is agnostic to the d3 vs. d2 relationship mentioned above (e.g., the second metal lines 14 can fully enclose the metal via structures if the tip-to-tip spacing supports it (not illustrated), or d3 can be greater than d2 as is shown in FIG. 2B).

Figure 3B:
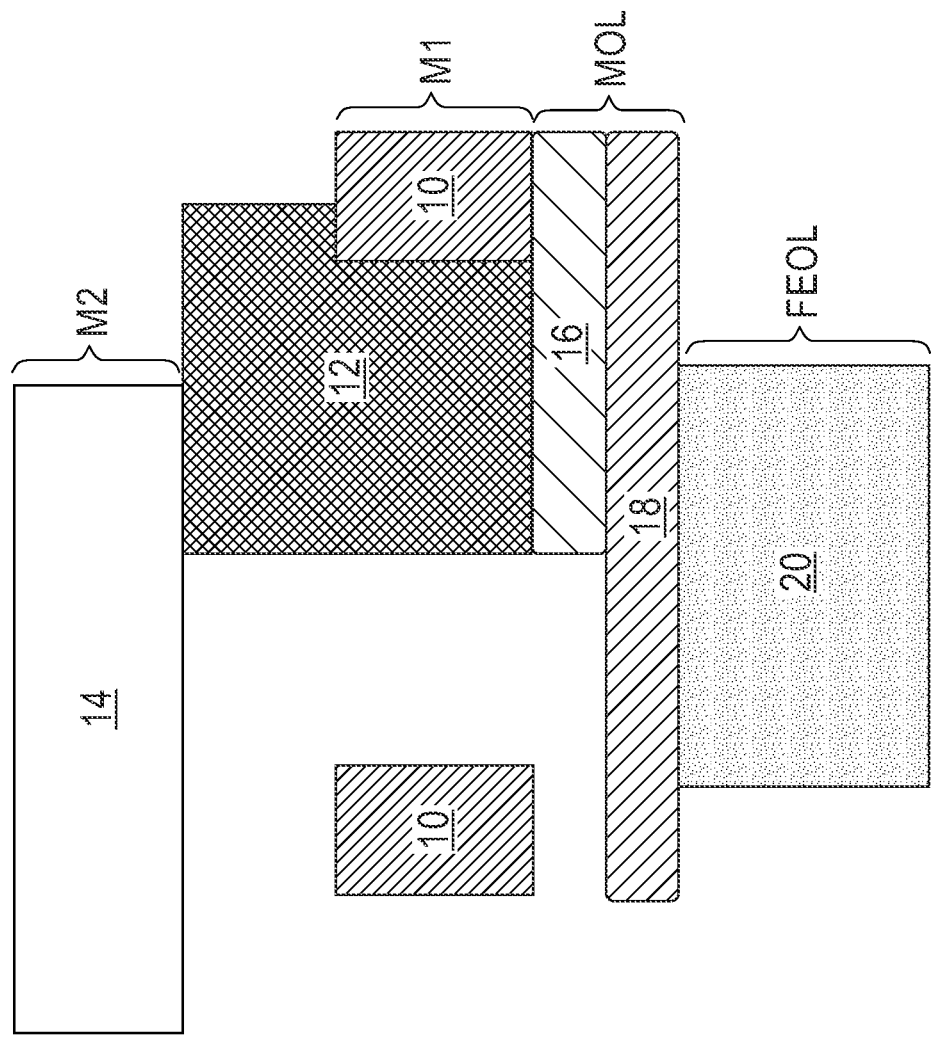
FIG. 3B is a cross sectional view of the exemplary structure shown in FIG. 3A; the cross section is through X-X shown in FIG. 3A.
Figure 3A:
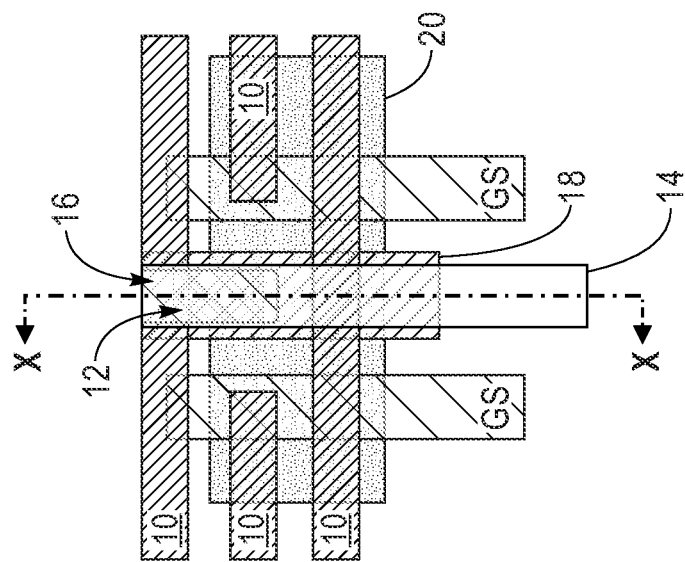
FIG. 3A is a top down view of an exemplary structure in accordance with yet another embodiment of the present application.

Reference is now made to FIGS. 3A-3B and 4A-4B, which illustrate other exemplary structures of the present application. In FIGS. 3A and 4A, GS denotes a gate structure; each gate structure GS includes a gate dielectric material layer and a gate electrode.

Notably, the exemplary structures shown in FIGS. 3A-3B and 4A-4B include a first metal level, M1, including a first metal line 10, a second metal level, M2, spaced apart from the first metal level, M1, and including a second metal line 14, and a first metal via structure 12 connecting the first metal line 10 to the second metal line 14, wherein the first metal via structure 12 directly contacts a sidewall surface and a horizontal surface of the first metal line 12. The first metal level, M1, can also include additional first metal lines 10 and the second metal level, M2, can include additional second metal lines 14. The exemplary structures shown in FIGS. 3A-3B and 4A-4B also include a middle-of-the-line (MOL) level and a front-end-of-the-line (FEOL) level. The MOL level includes a metal via 16 and a contact structure 18, and the FEOL level includes one or more semiconductor devices present in an active area 20.

In the present application, the term "semiconductor device" includes, for example, a transistor, capacitor, diode, or any combination thereof. In one example, the semiconductor device is a transistor that includes a source region, a drain region and a gate structure.

In the present application, the term "active area" denotes an area of a semiconductor wafer that includes the one or more semiconductor devices. Active area 20 typically includes a semiconductor material that has semiconducting properties. In one example, the active area 20 includes silicon as the semiconductor material.

The metal via 16 of the MOL level is composed of one of the electrically conductive materials mentioned above for the various metal lines and metal via structures present in the interconnect structure. The metal via 16 can include a diffusion barrier liner as mentioned above, and the metal via 16 can be embedded in a MOL dielectric material layer. The MOL dielectric material layer can include one of the dielectric materials mentioned above for the various interlayer dielectric material layers.

The contact structure 18 can be a source/drain contact structure and/or a gate contact structure. The contact structure 18 can be embedded in the MOL dielectric material layer. The contact structure 18 can be composed of at least a contact conductor material. The contact conductor material can include, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. The contact structure 18 can also include one or more contact liners (not shown). In one or more embodiments, the contact liner (not shown) can include a diffusion barrier material. In one or more embodiments in which a contact liner is present, the contact liner (not shown) can include a silicide liner, such as Ti, Ni, NiPt, etc., and a diffusion barrier material, as defined above.

In the exemplary structure shown in FIGS. 3A-3B, the first metal line 10 and the first metal via structure 12 are both in direct contact with the metal via 16, and metal via 16 is in direct contact with the contact structure 18 that contacts the active area 20.

In the exemplary structure shown in FIGS. 4A-4B, the first metal via structure 12 is in direct contact with the metal via 16, and the metal via 16 is in direct with the contact structure 18 that contacts the active area 20; in this exemplary structure, the first metal line 10 does not directly contact the metal via 16 of the MOL level. An electrical contact between the first metal line 10 and the metal via 16 is provided by the first metal via structure 12. This configuration provides a local connection.

The FEOL level and the MOL level of the exemplary structures of the present application can be formed utilizing FEOL processing techniques and MOL processing techniques that are well known to those skilled in the art. The interconnect including the first metal level, M1, the first metal via structure 12 and the second metal level, M2 can be formed by first forming the first metal level, M1. In some embodiments, the first metal level M1 including the first metal lines 10 can be formed utilizing a damascene process. A damascene process can include depositing a first interlayer dielectric material layer, forming first line openings in the first interlayer dielectric material layer, and then forming a first metal line 10 in each of the first line openings. The depositing of the first interlayer dielectric material layer can include, for example, CVD, plasma enhanced chemical vapor deposition (PECVD) or spin-on coating. The first line openings can be formed by lithography and etching. The forming of the first metal lines 10 includes depositing (e.g., CVD, PECVD, atomic layer deposition (ALD), sputtering, or plating) at least an electrically conductive material in each of the first line openings and then performing a planarization process such as, for example, chemical mechanical polishing (CMP). In other embodiments, the first metal level M1 including the first metal lines 10 can be formed utilizing a subtractive etching process. In a subtractive etching process, the first metal lines 10 are formed by depositing a layer of electrically conductive material, and then patterning (by lithography and etching) the layer of electrically conductive material. Next, the first interlayer dielectric material layer is deposited and planarized to provide the first metal level, M1. After forming the first metal level, M1, the second interlayer dielectric material layer is formed, followed by forming a first metal via opening in the second interlayer dielectric material layer and the first interlayer dielectric material layer. The first metal via open is formed by lithography and etching, and in a manner that allows physical exposure of a sidewall and a horizontal surface of one the first metal lines 10; note that one of the first metal lines can be cute into segments to permit adequate space for the first metal via structure 12 that will be subsequently formed into the first metal via opening. The first metal via structure 12 is formed by depositing at least an electrically conductive material, followed by planarization. The second metal level, M2, can be formed utilizing the damascene or subtractive etching process mentioned above for forming the first metal level, M2. The second metal level, M2, includes second metal lines 14 that are orthogonal to the first metal lines 10 and wherein one of the second metal lines 14 has a horizontal surface that contacts the first metal via structure 12 that contacts the sidewall and a portion of the horizontal surface of at least one of the first metal lines 10.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A structure comprising:
   a first metal level comprising a first metal line;
   a second metal level spaced apart from the first metal level and comprising a second metal line; and
   a first metal via structure connecting the first metal line to the second metal line, the first metal via structure comprises a first portion located between a first outermost sidewall and a second outermost sidewall of the second metal line and a second portion that extends beyond the first outermost sidewall or the second outermost sidewall of the second metal line, wherein the first metal via structure directly contacts a sidewall surface and a horizontal surface of the first metal line.

2. The structure of claim 1, wherein the first metal via structure directly contacts a horizontal surface of the second metal line.

3. The structure of claim 1, wherein the second metal line is orthogonally orientated to the first metal line.

4. The structure of claim 1, wherein the first metal via structure has a first outermost sidewall and a second outermost sidewall, wherein the first outermost sidewall of the first metal via structure is located between the first outermost sidewall of the second metal line and the second outermost sidewall of the second metal line, and the second outermost sidewall of the first metal via structure is located between a first outermost sidewall of the first metal line and a second outermost sidewall of the first metal line.

5. The structure of claim 1, wherein the first metal line has a first height and the first metal via structure has a second height, wherein the second height is greater than the first height.

6. The structure of claim 1, wherein the first metal via structure has a horizontal surface that is coplanar with a horizontal surface of the first metal line.

7. The structure of claim 1, wherein the first metal level comprises at least one other first metal line, and the second metal level comprises at least one other second metal line, and wherein a second metal via structure connects the at least one other first metal line to the at least one other second metal line, wherein the second metal via structure directly contacts a sidewall surface and a horizontal surface of the at least one other first metal line.

8. The structure of claim 7, wherein the first metal line and the other first metal line are separated by a first distance, the first metal via structure and the second metal via structure are separated by a second distance, and the second metal line and the other second metal line are separated by a third distance, wherein the first distance is less than the second distance, and the second distance is less than the third distance.

9. The structure of claim 7, wherein the second metal via structure directly contacts a horizontal surface of the other second metal line.

10. The structure of claim 7, wherein the other second metal line is orthogonally orientated to the other first metal line.

11. The structure of claim 10, wherein the second metal via structure has a first outermost sidewall and a second outermost sidewall, wherein the first outermost sidewall of the second metal via structure is located between a first outermost sidewall of the other second metal line and a second outermost sidewall of the other second metal line, and the second outermost sidewall of the second metal via structure is located between a first outermost sidewall of the other first metal line and a second outermost sidewall of the other first metal line.

12. The structure of claim 7, wherein the first metal line and the at least one other first metal line have a first height and the first metal via structure and the second metal via structure have a second height, wherein the second height is greater than the first height.

13. The structure of claim 7, wherein the first metal via structure has a horizontal surface that is coplanar with a horizontal surface of the first metal line, and the second metal via structure has a horizontal surface that is coplanar with a horizontal surface of the other first metal line, and the horizontal surface of both the first metal via structure and the second metal via structure are coplanar with each other.

14. The structure of claim 1, wherein the first metal line is present in a row of first metal lines, wherein the first metal via structure is located in an opening that is located between other first metal lines that are located in the row of first metal lines.

15. The structure of claim 1, wherein the first metal level and the second metal level are located on a frontside of a semiconductor wafer comprising one or more semiconductor devices.

16. The structure of claim 15, wherein the first metal via structure and the first metal line are electrically conducted to the one or more semiconductor devices by a metal via and a contact structure.

17. The structure of claim 16, wherein at least the first metal via structure is present on the metal via.

18. A structure comprising:
a first metal level comprising a first metal line;
a second metal level spaced apart from the first metal level and comprising a second metal line; and
a first metal via structure connecting the first metal line to the second metal line, wherein the first metal via structure directly contacts a sidewall surface and a horizontal surface of the first metal line, and the first metal level and the second metal level are located on a backside of a semiconductor wafer comprising one or more semiconductor devices.

19. The structure of claim 18, wherein the first metal via structure and the first metal line are electrically conducted to the one or more semiconductor devices by a metal via and a contact structure.

20. A structure comprising:
a first metal level comprising a first metal line;
a second metal level spaced apart from the first metal level and comprising a second metal line; and
a first metal via structure connecting the first metal line to the second metal line, wherein the first metal via structure directly contacts a sidewall surface and a horizontal surface of the first metal line, and the first metal via structure contacts a horizontal surface and a sidewall surface of another first metal line present in the first metal level.

* * * * *